(12) United States Patent  (10) Patent No.: US 9,225,321 B2
Bal et al.  (45) Date of Patent: Dec. 29, 2015

(54) SIGNAL SYNCHRONIZING SYSTEMS AND METHODS

(75) Inventors: Ankur Bal, Greater Noida (IN); Anupam Jain, New Delhi (IN)

(73) Assignee: STMicroelectronics International N.V., Amsterdam (NL)

( * ) Notice: Subject to any disclaimer, the term of this patent is extended or adjusted under 35 U.S.C. 154(b) by 659 days.

(21) Appl. No.: 13/172,647

(22) Filed: Jun. 29, 2011

(65) Prior Publication Data

US 2012/0166856 A1  Jun. 28, 2012

(30) Foreign Application Priority Data

Dec. 28, 2010 (IN) ............................ 3124/DEL/2010

(51) Int. Cl.
 *G06F 1/12* (2006.01)
 *G06F 1/00* (2006.01)
 *H03K 5/135* (2006.01)
 *H04L 7/02* (2006.01)

(52) U.S. Cl.
 CPC ........ *H03K 5/135* (2013.01); *H04L 7/02* (2013.01); *G06F 1/12* (2013.01)

(58) Field of Classification Search
 CPC ..................................... G06F 1/08; G06F 1/12
 USPC .................................................. 713/400, 500
 See application file for complete search history.

(56) References Cited

U.S. PATENT DOCUMENTS

| | | | | |
|---|---|---|---|---|
| 5,555,213 A | * | 9/1996 | DeLong | 326/93 |
| 5,767,720 A | * | 6/1998 | Osera et al. | 327/295 |
| 5,990,811 A | * | 11/1999 | Morimoto | 341/61 |
| 6,008,680 A | * | 12/1999 | Kyles et al. | 327/277 |
| 6,150,859 A | * | 11/2000 | Park | 327/158 |
| 6,687,319 B1 | * | 2/2004 | Perino et al. | 375/367 |
| 7,065,169 B2 | * | 6/2006 | Hartwell | 375/354 |
| 7,385,861 B1 | * | 6/2008 | Zhu | 365/194 |
| 2002/0046384 A1 | * | 4/2002 | Hartwell | 714/791 |
| 2002/0070761 A1 | * | 6/2002 | Abbiate et al. | 327/48 |
| 2003/0034809 A1 | * | 2/2003 | Nakashima | 327/113 |
| 2003/0068003 A1 | * | 4/2003 | Casagrande | 377/47 |
| 2004/0124899 A1 | * | 7/2004 | Cavazos et al. | 327/199 |
| 2006/0031728 A1 | * | 2/2006 | Warren et al. | 714/724 |
| 2009/0153182 A1 | * | 6/2009 | Yamaoka et al. | 326/16 |
| 2010/0001769 A1 | * | 1/2010 | Brantley et al. | 327/144 |
| 2011/0161719 A1 | * | 6/2011 | Lin et al. | 713/600 |

OTHER PUBLICATIONS http://www.cs.kent.edu/~batcher/CS10051/c5.html, "Computer Systems Organization",10 pages,Sep. 19, 2006.*

(Continued)

*Primary Examiner* — Jaweed A Abbaszadeh
*Assistant Examiner* — Phil Nguyen
(74) *Attorney, Agent, or Firm* — Gardere Wynne Sewell LLP

(57) ABSTRACT

Signal synchronizing systems and methods are disclosed. A signal synchronizing system includes a sequential logic circuit to receive an input signal and to generate a plurality of intermediate signals from the input signal based on a clock signal. A logic circuit combines the intermediate signals to generate an output signal. A signal receiver includes a microcontroller and a signal synchronizer coupled to the microcontroller. The signal synchronizer includes a sequential logic circuit to receive an input signal from a transmitter and to generate a plurality of intermediate signals from the received input signal based on a clock signal. A logic circuit combines the intermediate signals to generate an output signal.

21 Claims, 7 Drawing Sheets

(56) References Cited

OTHER PUBLICATIONS https://msdn.microsoft.com/en-us/library/aa288734(v=vs.71).aspx, "Delegates in Action with J", 11 pages, Jan. 2005.*

* cited by examiner

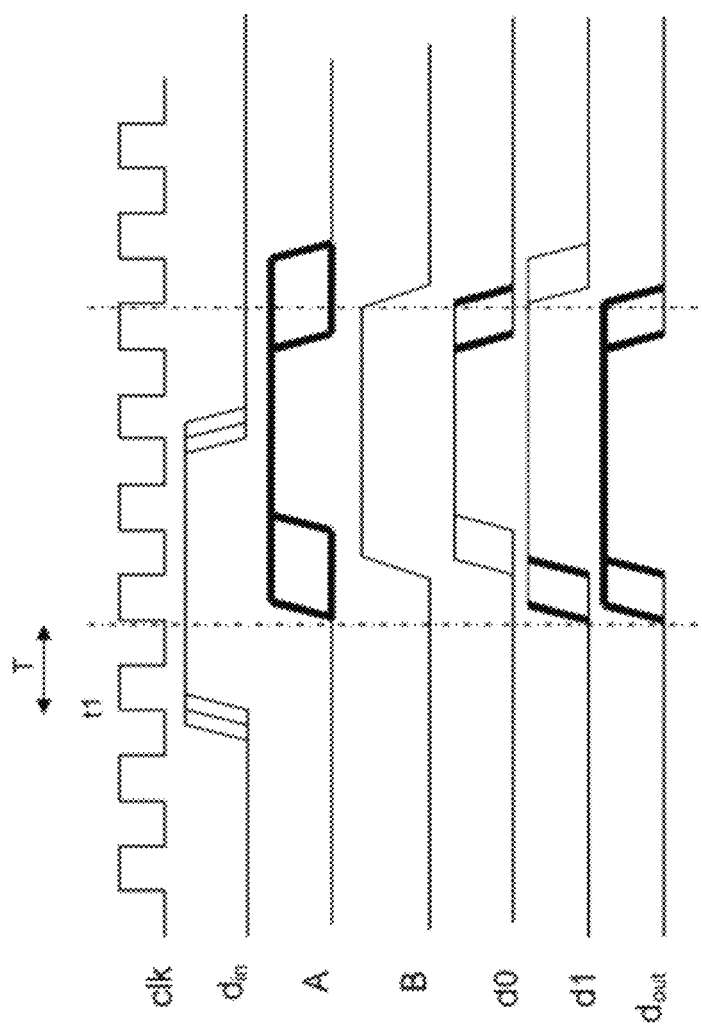

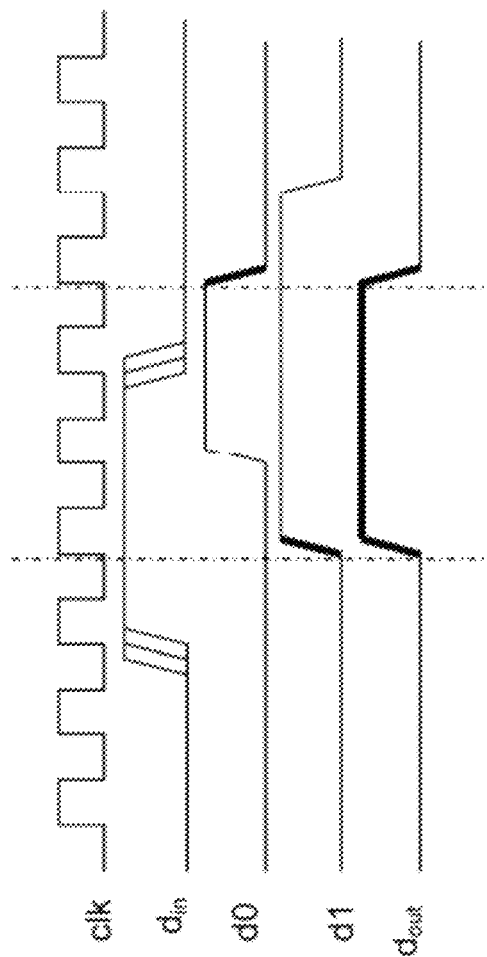

SIGNAL SYNCHRONIZING SYSTEMS AND METHODS

PRIORITY CLAIM

The instant application claims priority to Indian Patent Application No. 3124/DEL/2010, filed Dec. 28, 2010, which application is incorporated herein by reference in its entirety.

TECHNICAL FIELD

Signal synchronizing systems and methods are disclosed, and more particularly, a signal receiver and a communication system.

BACKGROUND

In digital circuits, synchronizers that prevent metastability and synchronize data across different unrelated clock domains may suffer from unpredictable data transfer delays across the domains. In designs that use such signals as relative time stamps or, alternatively, where such signals have to be applied or released within a deterministic time, significant phase and latency error margins have to be taken care of.

For example, a basic synchronizer that may include series-coupled flip-flops (FFs) may be used to prevent metastability and to minimize mean time between failures (MTBF). This arrangement may result in unpredictable phase offsets and may suffer from minimum pulse width constraints.

SUMMARY

According to a first aspect, a signal synchronizing system may include a sequential logic circuit to receive an input signal and generate a plurality of intermediate signals from the input signal based on a clock signal, and a logic circuit to combine the intermediate signals for generating an output signal. The input signal may comprise an asynchronous signal, and the output signal may comprise a synchronous signal.

The sequential logic circuit may comprise a plurality of flip flops comprising a plurality of first-stage flip flops, wherein the first-stage flip flops may be configured to be coupled in series to a respective plurality of second-stage flip flops.

The respective inputs of the first-stage flip flops may be configured to receive the input signal. The plurality of intermediate signals may comprise respective output signals of the plurality of second-stage flip flops.

Clock inputs to the flip flops may be derived from the clock signal to be time-offset from each other. The clock inputs to a selected first group of flip flops may be configured to be inverted. The clock inputs to a selected second group of flip flops may be configured to be delayed.

The flip flops may comprise D-type flip flops.

The logic circuit may comprise a pair of logic gates, wherein each of the logic gates may be configured to receive the plurality of intermediate signals as inputs.

The pair of logic gates may comprise an AND gate and an OR gate.

The system may further comprise a combinational logic circuit, wherein the combinational logic circuit may be configured to receive outputs of the AND and OR logic gates as inputs.

The combinational logic circuit may be configured to receive a delayed signal obtainable from one of the outputs of the logic gates.

The combinational logic circuit may be configured to generate the output signal rising with the rising edge of the OR logic gate output signal and falling with the falling edge of the AND logic gate output signal.

According to a second aspect, a signal receiver may include a microcontroller, and a signal synchronizer configured to be coupled to the microcontroller. The signal synchronizer may further include a sequential logic circuit to receive an input signal from a transmitter and generate a plurality of intermediate signals from the input signal based on a clock signal, and a logic circuit configured to combine the intermediate signals for generating an output signal.

According to a third aspect, a communication system may include a signal transmitter, a signal receiver to receive an input signal from the transmitter. The signal receiver may include a microcontroller. A signal synchronizer may be configured to be coupled to the microcontroller that may include a sequential logic circuit to receive the input signal from the transmitter and generate a plurality of intermediate signals from the received input signal based on a clock signal. A logic circuit may be configured to combine the intermediate signals for generating an output signal.

According to a fourth aspect, a signal synchronizing method may include receiving an input signal, generating a plurality of intermediate signals from the received input signal based on a clock signal. The intermediate signals may be combined to generate an output signal.

BRIEF DESCRIPTION OF THE DRAWINGS

Various embodiments are described in detail in the discussion below and with reference to the following drawings.

FIG. 2b shows graphs of signals in the circuit of FIG. 2a with respect to time, according to the various embodiments.

FIG. 3b shows graphs of signals in the circuit of FIG. 3a with respect to time, according to the various embodiments.

DETAILED DESCRIPTION

Figure 1A:
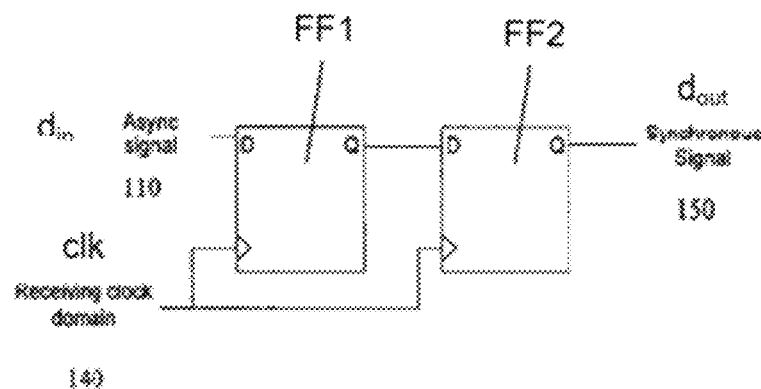
FIG. 1a is a schematic view of a conventional synchronizer comprising series-coupled flip-flops.
Figure 1B:
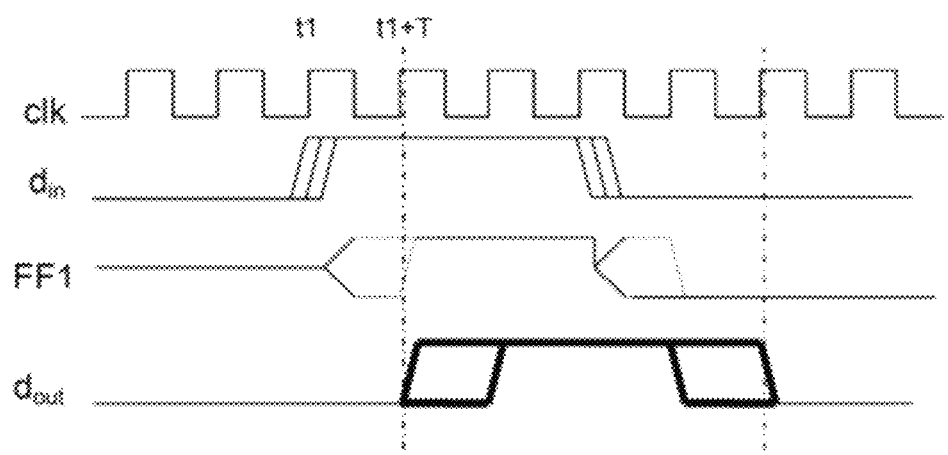
FIG. 1b is a graph of signals in the synchronizer of FIG. 1a with respect to time.

FIG. 1a shows a schematic circuit diagram illustrating a synchronizer comprising series-coupled flip-flops FF1, FF2. FIG. 1b shows graphs of signals in the circuit of FIG. 1a with respect to time. An input signal $d_{in}$ to the first flip-flop FF1 may come from asynchronous domains with unpredictable time stamps, as illustrated by multiple lines at the rising and falling edges of the input signal in FIG. 1b. As a result, an output from the first flip-flop FF1 can have metastability issues as the metastability may be probabilistically resolved to either a 'high' value (i.e., a logic level 1) at time t1, or remain 'low' (i.e., a logic level 0) for an additional clock period and change to 'high' at time t1+T. This uncertainty is carried forward through the second flip-flop FF2 (which may delay the output from the first flip-flop FF1 by one clock period) such that the output signal $d_{out}$ contains an error of ±1 clock period, as shown in FIGS. 1a and 1b. That is, if the pulse width of the input signal $d_{in}$ is equal or less than 1 clock period, the input signal $d_{in}$ may be "lost" (i.e., not detected) by the system.

Prior attempts to use multiple flip flops to try to circumvent the above problem in a limited manner have been attempted, but these are typically not entirely effective in removing metastability. One approach may include a two-stage synchronizer in which the second flip flop receives the output of the first flip flop as its clock input. However, such synchronizer requires an external processor to process partial outputs. Also, metastability can still enter in the second stage clock input, and there is no reduction in the error width.

Another approach may include a metastability filtering circuit comprising series-coupled flip flops. However, this approach requires time for initial settling, and may not be suitable for a time-varying clock signal. Furthermore, as an additional clock signal (T1) is needed as input, such approach may suffer from T1 edge miss, i.e., the rising and falling edges do not occur at predetermined time.

Yet another approach may use a digital de-skew system to help prevent metastability. However, this approach may not work for a time-varying clock signal.

Figure 2A:
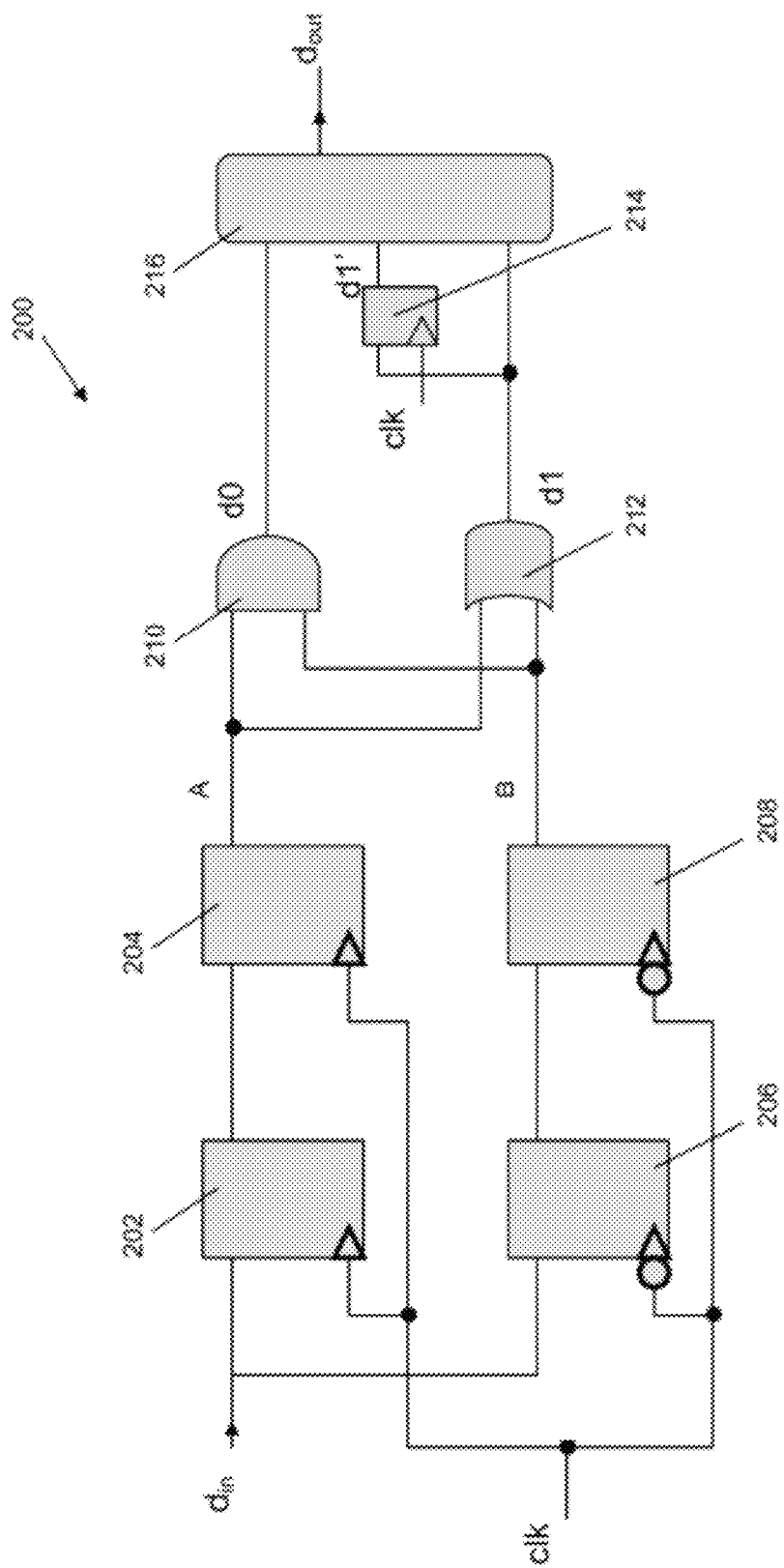
FIG. 2a shows a schematic of a signal synchronizing system according to the various embodiments.

FIG. 2a shows a schematic circuit diagram illustrating a signal synchronizing system 200 according to an example embodiment. FIG. 2b shows graphs of signals in the circuit of FIG. 2a with respect to time.

The system 200 may include a sequential logic circuit in the form of a plurality of D-type flip flops 202, 204, 206, 208, which may be arranged such that an input signal $d_{in}$, e.g., from asynchronous domains, is provided in parallel to respective D-inputs of flip flops 202 and 206. In addition, respective flip flop pairs 202 and 204, 206 and 208 are series-coupled (i.e., output from first-stage flip flop 202 is coupled to the D-input of second-stage flip flop 204, and output from first-stage flip flop 206 is coupled to the D-input of second-stage flip flop 208). A clock signal CLK may be directly coupled to respective clock inputs of flip flops 202 and 204. The same clock signal CLK may be inverted and coupled to respective clock inputs of flip flops 206 and 208. It will be appreciated that the sequential logic circuit may comprise other types of flip flops.

Still referring to FIG. 2a, outputs A and B from $2^{nd}$-stage flip flips 204 and 208 may be coupled to each of logic gates 210 and 212. In the various embodiments, logic gate 210 comprises an AND gate, while logic gate 212 comprises an OR gate. Respective outputs d0 and d1 from the logic gates 210 and 212 may then be combined with an output d1' of another D-type flip flop 214 using e.g., a combinational logic circuit 216 to generate a single output $d_{out}$. In the various embodiments, as shown in FIG. 2a, the D-input of flip flop 214 may be coupled to d1. It will be appreciated that the D-input of flip flop 214 may be coupled to d0 in the various embodiments. Table 1 shows a suitable (i.e., one of many possible) truth table of the combinational logic circuit 216 used in the various embodiments. In Table 1, np denotes "Not Possible".

TABLE 1

| d0 | d1 | d1' | dout |
|---|---|---|---|
| 0 | 0 | 0 | 0 |
| 0 | 0 | 1 | 0 |
| 0 | 1 | 0 | 1 |
| 0 | 1 | 1 | 0 |

TABLE 1-continued

| d0 | d1 | d1' | dout |
|---|---|---|---|
| 1 | 0 | 0 | np |
| 1 | 0 | 1 | np |
| 1 | 1 | 0 | 1 |
| 1 | 1 | 1 | 1 |

With reference now to FIG. 2b, operation of the circuit 200 will now be described. In the various embodiments, the input signal $d_{in}$ may comprise a pulse (with unpredictable time stamps) that rises e.g., at time t and has a pulse width of approximately three clock periods (3T). As a result, output A from flip flop 204 comprises a pulse starting at approximately t+T and having a pulse width of approximately 3T±T (i.e., an error of ±T).

In addition, as described above, the clock signal CLK may be inverted before coupling to flip flops 206 and 208. Thus, flip flops 206 and 208 may be triggered approximately half-a-clock period later than flip flops 202 and 204 respectively, at which time the input signal $d_{in}$ has stabilized as either high or low. As a result, output B from flip flop 208 comprises a pulse starting at approximately t+1.5T and having a pulse width of approximately 3T (i.e., a substantially reduced error).

As logic gate 212 comprises an OR gate, its output d1 rises as long as either A or B is high. That is, when the input signal $d_{in}$ rises, such change is captured by the output d1, which has an error of about half-a-clock period (i.e., the 0.5T overlap between t+T and t+1.5T). Also, as logic gate 210 comprises an AND gate, its output d0 falls as long as one of A and B is low. That is, when the input signal $d_{in}$ falls, such change is captured by the output d0, which also has an error of about half a clock period (0.5T).

By configuring the combinational logic circuit 216 to generate the output $d_{out}$ that is based on d1 when the input $d_{in}$ is changing from low to high (i.e., 0 to 1), and based on d0 when the input $d_{in}$ is changing from high to low (i.e., 1 to 0), the system according to the various embodiments are capable of registering the correct data while significantly reducing the error. For example, and with reference to FIGS. 2a and 2b, the output signal $d_{out}$ has a pulse width of about 3T±0.5T (i.e. the maximum error is about half a clock period).

In the various embodiments, as shown in FIGS. 2a and 2b, inverting the clock signal CLK introduces a trigger difference of approximately 0.5T to the clock inputs of flip flops 206 and 208, as compared to flip flops 202 and 204, thereby a time-offset of 0.5T between outputs A and B. This may reduce the error in the output signal $d_{out}$ by approximately one-half, as described in detail above. The error may be further reduced by reducing the trigger difference, e.g., by using a combination of more flip flops with appropriate delaying and/or inverting.

Figure 3A:
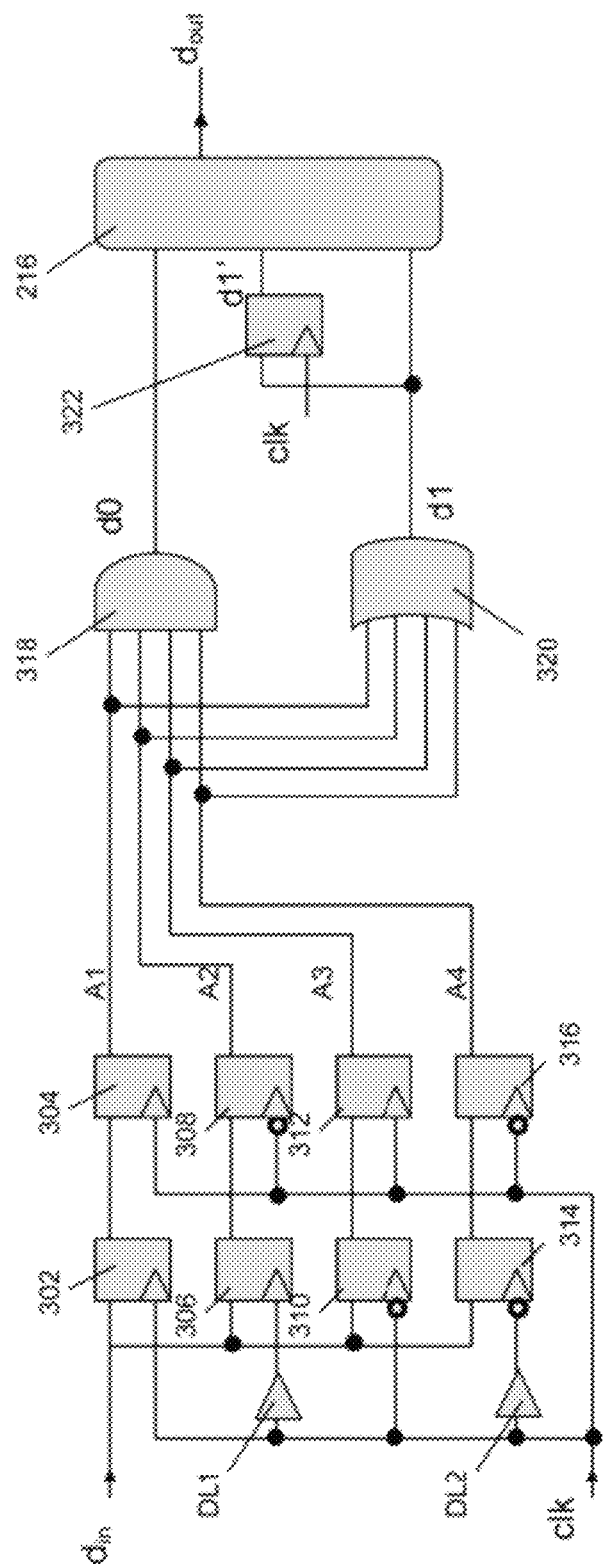
FIG. 3a shows a schematic circuit diagram illustrating a signal synchronizing system, according to the various embodiments.

FIG. 3a shows a schematic circuit diagram illustrating a signal synchronizing system 300, according to the various embodiments. FIG. 3b shows graphs of signals in the circuit of FIG. 3a with respect to time.

In the various embodiments, the system 300 may comprise additional flip flops. As shown in FIG. 3a, four pairs of series-coupled D-type flip flops (302 and 304, 306 and 308, 310 and 312, 314 and 316) may be present. The clock signal CLK to some of the flip flops may be inverted. In addition, the system 300 may comprise delay devices DL1, DL2 coupled to clock inputs of some of the first-stage flip flops. Delay devices DL1 and DL2 are configured to provide different delays so that different combinations of delaying and inverting may be provided to the clock inputs of the pairs of series-coupled flip flops. Thus, the first-stage flip flops 302, 306, 310 and 314 may be triggered at slightly different times.

As a result, outputs A1, A2, A3, A4 from the second-stage flip flops 304, 308, 312, 316 respectively are time-offset from each other. These outputs may be coupled to each of logic gates 318 (AND gate) and 320 (OR gate). Also, respective outputs d0 and d1 from the logic gates 318 and 320 may then be combined with an output d1' of another D-type flip flop 322 using e.g., the same combinational logic circuit 216 as described previously, to generate a single output $d_{out}$.

Still referring to FIG. 3b, additional improvements in error reduction may be obtained due to a change in the input signal $d_{in}$ from low to high that is detected by d1 with even lower uncertainty. Likewise, a change in the input signal $d_{in}$ from high to low is detected by output d0 with even lower uncertainty. In other words, the maximum error is substantially less than half a clock period.

It will be appreciated that while the system 300 utilizes four pairs of series-coupled flip flops and two delay devices, a different number of such components can be used in the various embodiments to achieve other error reductions.

The system of the various embodiments may provide an effective solution, in which data pulse width uncertainty may reduce. In addition, the latency between input and output data is low (~1T). In the various embodiments using a chain of n-FFs, the latency is approximately n−1 clock cycles. Also, the system may be implemented with minimal area overhead, and may be suitable for integration with existing digital systems.

Figure 4:
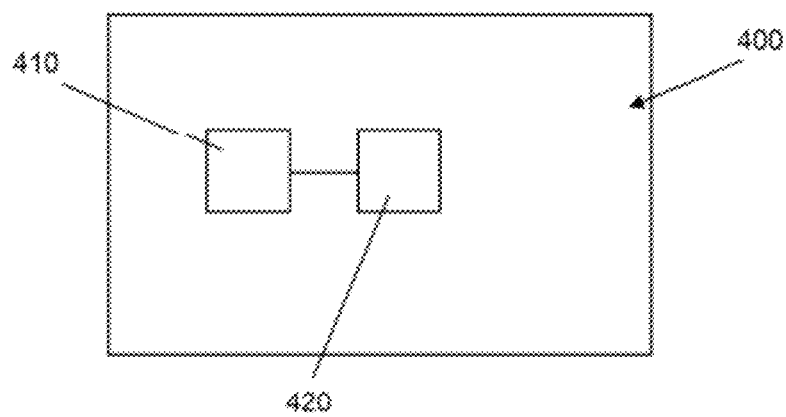
FIG. 4 shows a block diagram illustrating a signal receiver comprising a signal synchronizing system according to the various embodiments.

FIG. 4 shows a block diagram illustrating a signal receiver 400 comprising a signal synchronizing system 410 (herein interchangeably referred to as a signal synchronizer 410), as described above with respect to FIG. 2 or 3. The signal receiver 400 may comprise a microcontroller 420 configured to be coupled to the signal synchronizer 410, and other components, e.g., an amplifier, modulator, etc. (not shown). The signal receiver 400 typically receives the input signal from a transmitter (not shown).

Figure 5:
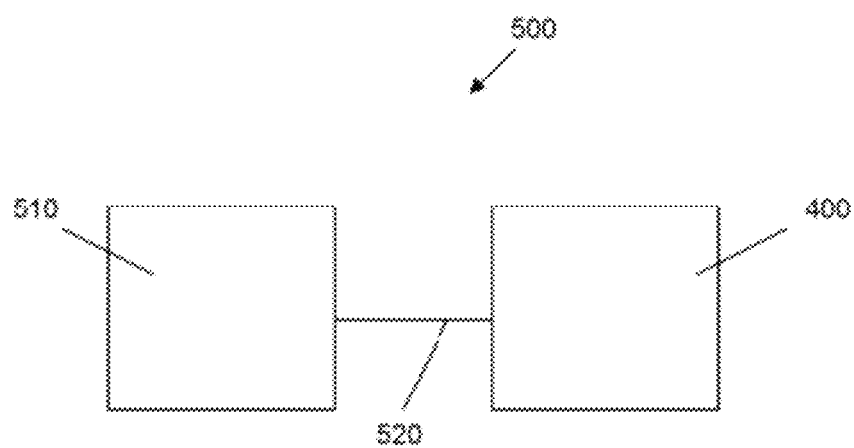
FIG. 5 shows a block diagram illustrating a communication system comprising a signal transmitter, and the signal receiver of FIG. 4, according to the various embodiments.

FIG. 5 shows a block diagram illustrating a communication system 500 comprising a signal transmitter 510, and a signal receiver 400 as described above with respect to FIG. 4. Here, the signal receiver 400 may be configured to be coupled to, and receive the input signal from, the signal transmitter 510 (e.g., via a data link 520).

Figure 6:
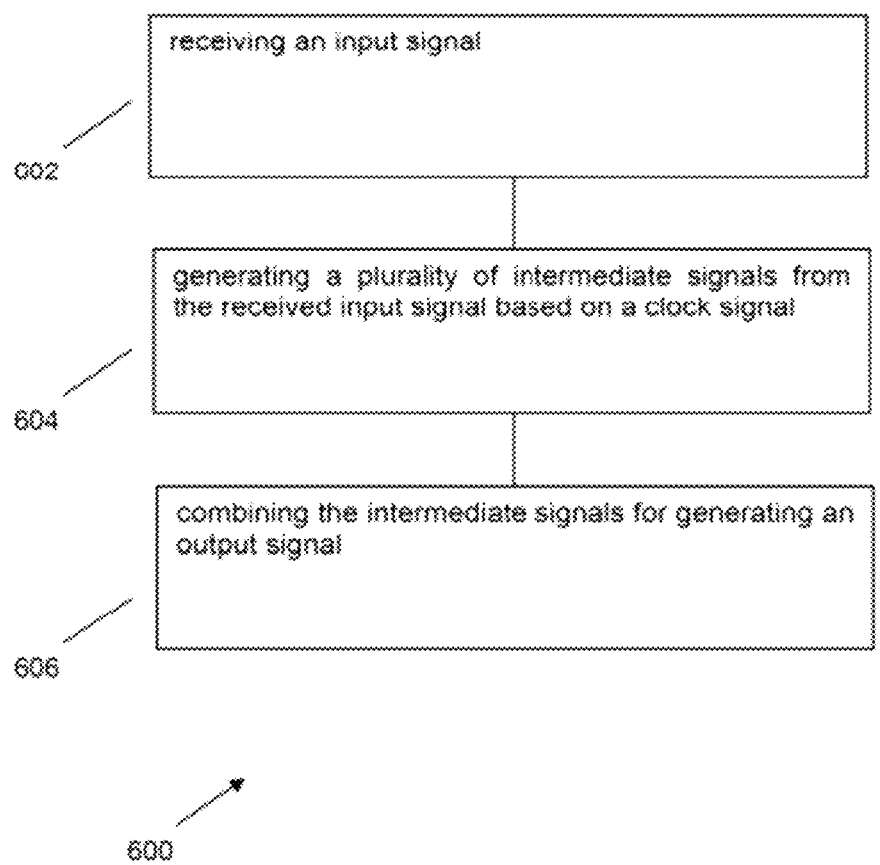
FIG. 6 shows a flow chart illustrating a signal synchronizing method, according to the various embodiments.

FIG. 6 shows a flow chart illustrating a signal synchronizing method 600 according to the various embodiments. At 602, an input signal is received. At 604, a plurality of intermediate signals are generated from the received input signal based on a clock signal. At 606, the intermediate signals are combined for generating an output signal.

From the foregoing it will be appreciated that, although embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A signal synchronizing system comprising:
   a sequential logic circuit comprising:
      a first sequential logic circuit configured to receive an input signal and generate a first intermediate signal from the input signal based on a single clock signal, the first sequential logic circuit comprising a first-stage flip flop coupled in series to a second-stage flip flop, the first-stage flip flop and second-stage flip flop being clocked by the single clock signal;
      a second sequential logic circuit to receive the input signal and generate a second intermediate signal from the input signal based upon an inverse of the single clock signal, the second sequential logic circuit comprising a first-stage flip flop coupled in series to a second-stage flip flop, the first-stage flip flop and second-stage flip flop being clocked by the inverse of the single clock signal; and
   a logic circuit configured to combine the first and second intermediate signals to generate an output signal, the logic circuit comprising a first logic gate to receive the first intermediate signal and the second intermediate signal and a second logic gate to receive the first intermediate signal and the second intermediate signal.

2. The system as claimed in claim 1, wherein the input signal comprises an asynchronous signal, and wherein the output signal comprises a synchronous signal.

3. The system as claimed in claim 1, wherein inputs of the first-stage flip flops are configured to receive the input signal.

4. The system as claimed in claim 1, wherein the first and second intermediate signals comprise respective output signals of the plurality of second-stage flip flops.

5. The system as claimed in claim 1, wherein clock inputs to the first-stage flip flop and the second-stage flip flop in the second sequential logic circuit are derived from the clock signal to be time-offset from the first-stage flip flop and the second-stage flip flop in the first sequential logic circuit.

6. The system as claimed in claim 5, wherein the clock inputs to a selected ones of the first stage flip flops are configured to be time-delayed.

7. The system as claimed in claim 1, wherein the first-stage flip flops of the first and seconds sequential logic circuits comprise D-type flip flops.

8. The system as claimed in claim 1, wherein the first and second logic gates comprise an AND gate and an OR gate.

9. The system as claimed in claim 8, comprising a combinational logic circuit configured to receive respective outputs of the AND and OR logic gates as inputs and generate the output signal.

10. The system as claimed in claim 9, wherein the combinational logic circuit further receives a delayed signal output from one of the outputs of the first and second logic gates.

11. The system as claimed in claim 9, wherein the combinational logic circuit generates the output signal rising with a rising edge of the OR logic gate output signal and falling with a falling edge of the AND logic gate output signal.

12. A signal receiver comprising:
   a microcontroller; and
   a signal synchronizer configured to be coupled to the microcontroller, the signal synchronizer comprising:
   a sequential logic circuit comprising:
   a first sequential logic circuit configured to receive an input signal from a transmitter and generate a first intermediate signal from the received input signal based on a single clock signal, the first sequential logic circuit comprising a first-stage flip flop coupled in series to a second-stage flip flop, the first-stage flip flop and second-stage flip flop being clocked by the single clock signal; and
   a second sequential logic circuit configured to receive the input signal and generate a second intermediate signal from the input signal based upon an inverse of the single clock signal, the second sequential logic circuit comprising a first-stage flip flop coupled in series to a second-stage flip flop, the first-stage flip flop and second-stage flip flop being clocked by the inverse of the single clock signal; and a logic circuit configured to combine the first and second intermediate signals to generate an output signal, the logic circuit comprising a first logic gate having inputs receiving the first intermediate signal and the second intermediate signal and a second logic gate having inputs receiving the first intermediate signal and the second intermediate signal.

13. The signal receiver of claim 12, wherein the first and second logic gates comprise an AND gate and an OR gate.

14. The signal receiver of claim 13, further comprising a combinational logic circuit configured to receive respective outputs of the AND and OR logic gates as inputs and generate the output signal.

15. The signal receiver of claim 14, wherein the combinational logic circuit is configured to receive a delayed signal from an output of the first and second logic gates.

16. The signal receiver of claim 14, wherein the combinational logic circuit is configured to generate the output signal rising with a rising edge of the OR logic gate output and falling with a falling edge of the AND logic gate output.

17. A communication system comprising:
a signal transmitter;
a signal receiver configured to be receive an input signal from the transmitter, the signal receiver comprising:
a microcontroller, and
a signal synchronizer coupleable to the microcontroller, wherein the signal synchronizer comprises a sequential logic circuit, the sequential logic circuit comprising:
a first sequential logic circuit configured to receive the input signal from the transmitter and generate a first intermediate signal from the received input signal based on a first clock signal, the first sequential logic circuit comprising a first-stage flip flop coupled in series to a second-stage flip flop, the first-stage flip flop and second-stage flip flop being clocked by the first clock signal, and
a second sequential logic circuit configured to receive the input signal from the transmitter and generate a second intermediate signal from the received input signal based upon an inverse of the first clock signal, the second sequential logic circuit comprising a first-stage flip flop coupled in series to a second-stage flip flop, the first-stage flip flop and second-stage flip flop being clocked by the inverse of the first clock signal; and
a logic circuit configured to combine the first and second intermediate signals for generating an output signal, the output signal comprising a first logic gate to receive the first intermediate signal and the second intermediate signal and a second logic gate to receive the first intermediate signal and the second intermediate signal.

18. The communication system of claim 17, wherein the first and second logic gates comprise an AND gate and an OR gate, respectively.

19. The communication system of claim 18, comprising a combinational logic circuit configured to receive respective outputs of the AND and OR logic gates as inputs.

20. The communication system of claim 19, wherein the combinational logic circuit is configured to receive a delayed signal from an output of the first and second logic gates.

21. The communication system of claim 19, wherein the combinational logic circuit is configured to generate the output signal rising with a rising edge of the OR logic gate output and falling with a falling edge of the AND logic gate output.

* * * * *